United States Patent
Rao et al.

(10) Patent No.: US 10,061,340 B1
(45) Date of Patent: Aug. 28, 2018

(54) BANDGAP REFERENCE VOLTAGE GENERATOR

(71) Applicant: Invecas, Inc., Santa Clara, CA (US)

(72) Inventors: Venkata N. S. N. Rao, Fremont, CA (US); Majid Jalali Far, San Jose, CA (US)

(73) Assignee: Invecas, Inc., Santa Clara, CA (US)

( * ) Notice: Subject to any disclaimer, the term of this patent is extended or adjusted under 35 U.S.C. 154(b) by 0 days.

(21) Appl. No.: 15/879,355

(22) Filed: Jan. 24, 2018

(51) Int. Cl.
*G05F 3/26* (2006.01)
*H03F 3/04* (2006.01)
*H03K 5/24* (2006.01)
*G05F 3/30* (2006.01)

(52) U.S. Cl.
CPC ............... *G05F 3/26* (2013.01); *G05F 3/267* (2013.01); *G05F 3/30* (2013.01); *H03F 3/04* (2013.01); *H03K 5/24* (2013.01)

(58) Field of Classification Search
CPC ............... G05F 3/26; G05F 3/267; G05F 3/30
See application file for complete search history.

(56) References Cited

U.S. PATENT DOCUMENTS

| | | | |
|---|---|---|---|
| 5,867,013 A | 2/1999 | Yu | |
| 6,784,652 B1 | 8/2004 | Aude | |
| 8,106,644 B2 | 1/2012 | Kalyanaraman | |
| 8,228,053 B2 | 7/2012 | Stellberger et al. | |
| 9,519,304 B1 * | 12/2016 | Far | G05F 3/262 |
| 9,780,652 B1 * | 10/2017 | Far | H02M 3/158 |
| 2006/0197584 A1 * | 9/2006 | Hsu | G05F 3/30 |
| | | | 327/539 |
| 2008/0231248 A1 | 9/2008 | Hung | |
| 2018/0017986 A1 * | 1/2018 | Lahiri | G05F 3/262 |

OTHER PUBLICATIONS

David J. Allstot, A Precision Variable-Supply CMOS Comparator, IEEE Journal of Solid-State Circuits, vol. SC-17, No. 6, Dec. 1982, p. 1081-1087.

* cited by examiner

*Primary Examiner* — Timothy J Dole
*Assistant Examiner* — Ishrat Jamali
(74) *Attorney, Agent, or Firm* — Venture Pacific Law, PC

(57) ABSTRACT

A bandgap reference voltage generator, comprises: a bias circuit configured to generate a start signal; a startup circuit having at least two serially-connected transistors configured to receive the start signal; a proportional-to-absolute-temperature ("PTAT") generation circuit having a first current mirror, an amplifier, a resistor, and transistors; and a complementary-to-absolute-temperature ("CTAT") generation circuit having a second current mirror, a passive network of resistors, and at least one transistor. The at least two serially-connected transistors are connected across a first input of the amplifier and a second input of the amplifier. An output of the amplifier is coupled to the first current mirror and the second current mirror. The passive network of resistors is coupled across outputs of the second current mirror. The CTAT generation circuit has an output node for outputting a bandgap reference voltage.

19 Claims, 5 Drawing Sheets

BANDGAP REFERENCE VOLTAGE GENERATOR

FIELD OF INVENTION

The disclosure generally relates to a bandgap reference voltage generator, and, more particularly, to a bandgap reference voltage generator having a startup circuit.

BACKGROUND

To generate a stable reference voltage over process, voltage, and/or temperature ("PVT") variations in today's electronics, a bandgap reference voltage generator is used for such electronics. Additionally, a startup circuit is necessary to make sure a bandgap reference voltage generator will work properly when the bandgap reference generator is connected to a power supply during startup. For instance, if the power supply has a slow rise time at low temperature and slow corner process, the startup may not occur in the bandgap reference voltage generator due to low current beta characteristics of bipolar transistors at low temperature conditions.

Some bandgap reference voltage generators can provide assistance for startup operations using a startup circuit. However, these bandgap reference voltage generators usually have several major drawbacks. Some conventional bandgap reference voltage generators cannot provide a fast-enough startup. Additionally, the bandgap reference voltage generators are overly complicated and power consuming, and do not do well with low supply voltages. Furthermore, startup circuits in such bandgap references voltage generators are highly reliant on the supply voltage VDD to determine an operation for the respective startup circuit. Another drawback is that the startup circuit undesirably affects the respective bandgap reference voltage generator even after startup has completed.

Therefore, it is desirable to provide improved methods, systems, and circuits for bandgap reference voltage generation that can reduce the various drawbacks.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

Figure 1:
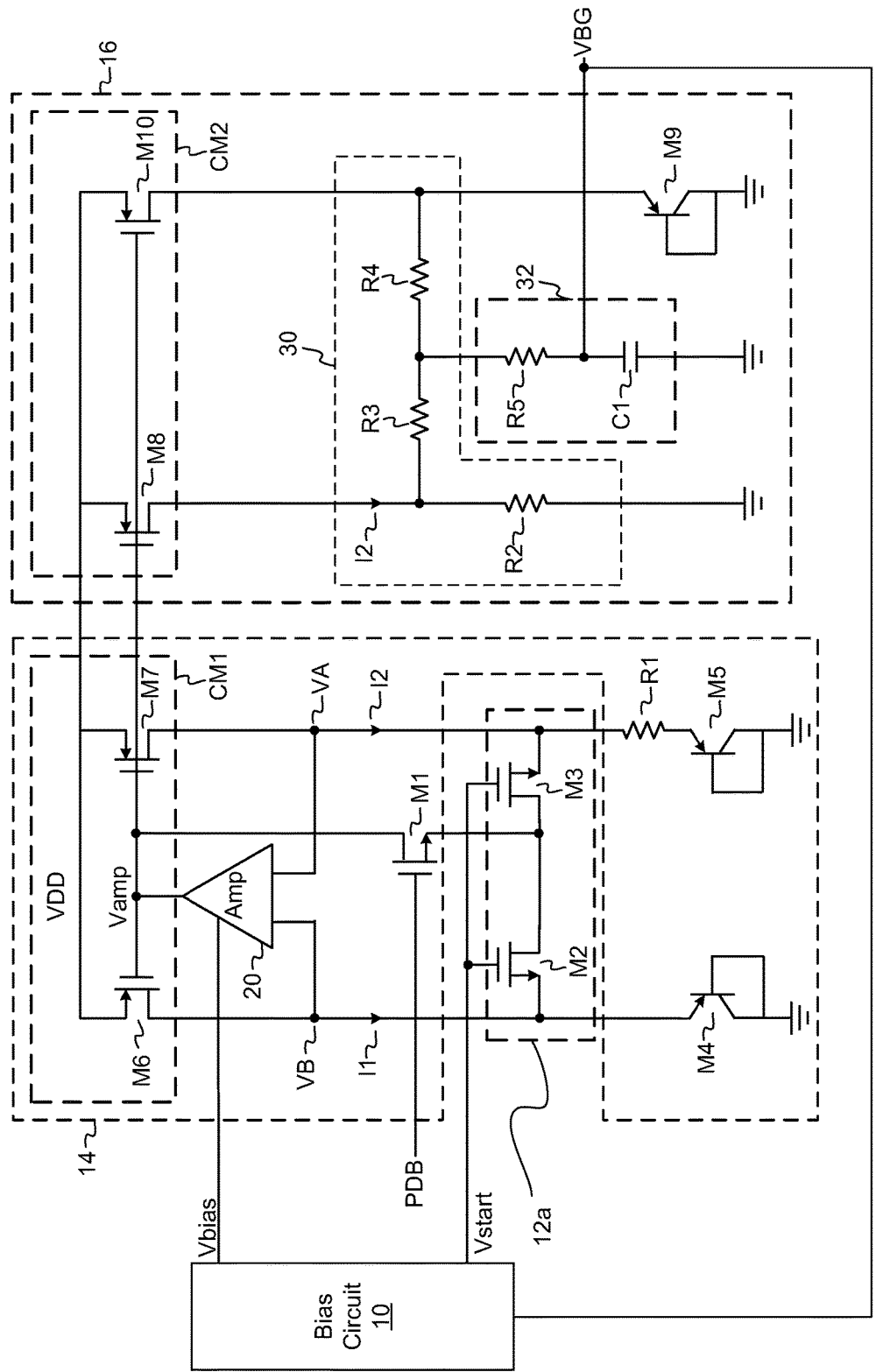
FIG. 1 illustrates a circuit diagram of an embodiment of a bandgap reference voltage generator of the present disclosure.

In the following detailed description of the embodiments, reference is made to the accompanying drawings, which form a part hereof, and in which is shown by way of illustration of specific embodiments in which the disclosure may be practiced. The present disclosure may, however, be embodied in different forms and should not be construed as limited to the embodiments set forth herein. It is also appreciated that the terms such as the terms "first", "second", "third", etc. are used to distinguish between elements such terms describe. These terms are not necessarily intended to indicate temporal or prioritization of such elements, unless otherwise explicitly stated.

In an embodiment, a bandgap reference ("BGR") voltage generator having a startup circuit ("BGR") can be designed to have the startup circuit coupled between an output and an input of the bandgap reference voltage core. Once a bandgap reference voltage output is less than a startup voltage threshold, the startup circuit can be activated by a startup voltage. The bandgap reference voltage core can comprise a proportional-to-absolute-temperature ("PTAT") generation circuit and a complementary-to-absolute-temperature ("CTAT") generation circuit.

The startup circuit can initiate an output of a self-biased operational amplifier of the bandgap reference voltage core, causing the BGR to provide a desired bandgap reference output, i.e., at a bandgap reference voltage. The startup circuit can be turned off once the bandgap reference output reaches the startup threshold voltage so as to not affect the BGR after startup is completed.

The bandgap reference voltage can be taken as feedback from the BGR output to operate the startup circuit. By using such feedback, the BGR can provide good power-up characteristics, which satisfy accuracy and stability requirements over a wide range of supply voltages, temperatures, and times required for analog circuits.

In yet another embodiment, a BGR's startup circuit can comprise a comparator for comparing an internal BGR voltage node with a reference voltage to determine whether a startup voltage is required. The reference voltage of the startup circuit can be self-generated or externally applied. Depending on the application and design of the BGR voltage generator, the reference voltage can be set accordingly. For instance, the reference voltage $V_{ref}$ can be set to be greater than a threshold voltage of an NMOS transistor (e.g., 0.5V). Additionally, the reference voltage $V_{ref}$ can be set to be half of the supply voltage (i.e., VDD/2). The comparator output of the startup circuit can determine a status for the startup circuit, i.e., whether the startup circuit is active or inactive.

When the voltage at the internal BGR voltage node is below the reference voltage, the comparator can indicate such condition to a bias circuit. The bias circuit can then generate a startup voltage for starting up of the BGR voltage generator. When the voltage at the internal BRG voltage node is equal to or greater than the reference voltage, the comparator can indicate such condition to the bias circuit, which in turn can deactivate the startup circuit of the BGR voltage generator.

The comparator can improve performance since it is coupled to an internal voltage node of the BGR and does not have to wait for a feedback of the bandgap reference voltage $V_{BG}$. Thus, a determination for the startup voltage value can be independent of the BGR output.

In further embodiments, a BGR can further comprise a passive component comprising a network of resistors for stabilizing the BGR output voltage over various PVT conditions by choosing an appropriate resistance values for the resistors of the passive component. The passive component can be designed to allow for a grounded pass for a capacitor used in the a BGR.

In other embodiments, a startup circuit can comprise two transistors to reduce current leakage and provide for a symmetrical structure. The two transistors can inject current to both branches of in a PTAT generation circuit, reducing the current leakage since there are two paths to ground. For instance, two transistors can be used to apply a $V_{amp}$ signal coming from an amplifier output of the BGR voltage generator across the inputs of the amplifier. Since the voltage, $V_{amp}$, is coming from the amplifier output, it is independent of supply voltage. Thus, the bias circuit and the amplifier can be functionally operational before starting the startup circuit and the remainder of the BGR components.

It can be appreciated that a startup circuit can be implemented with a plurality of transistors serially connected across the inputs of an amplifier of the PTAT generation circuit. For simplicity, the examples disclosed herein use two serially connected transistors in the startup circuit. However, such examples are not meant to be limiting in any way.

FIG. 1 illustrates a circuit diagram of an embodiment of a bandgap reference voltage generator of the present disclosure. A bandgap reference voltage generator of the present disclosure comprises: a bias circuit 10; a startup circuit 12a; a proportional-to-absolute-temperature ("PTAT") generation circuit 14 having a first current mirror CM1, an amplifier 20, transistors M1, M4, and M5, and a resistor R1; and a complementary-to-absolute-temperature ("CTAT") generation circuit 16 having a second current mirror CM2, a passive network 30 of resistors R2, R3, and R4, an RC filter 32 having a resistor R5 and a capacitor C1, and a transistor M9.

The bias circuit 10 determines whether the bandgap reference voltage $V_{BG}$ is at a certain threshold voltage. If not, the bias circuit 10 drives the $V_{START}$ signal (also referred to as the "start signal") high to activate the startup circuit 12a. If the bandgap reference voltage $V_{BG}$ is at or above the certain threshold voltage, the bias circuit 10 drives the $V_{START}$ signal low to deactivate the startup circuit 12a. The bias circuit 10 is coupled to the amplifier 20 to apply a biasing voltage $V_{bias}$.

The startup circuit 12a comprises transistors M2 and M3 that are serially connected across inputs of the amplifier 20. The serial connection between the transistors M2 and M3 is further connected to an output of the amplifier 20 via the transistor M1. The gate of the transistor M1 is coupled to a negated power down signal PDB to allow for powering down of the bandgap reference voltage generator. During normal operation, the transistor M1 is on. The $V_{START}$ signal from the bias circuit 10 is applied to the gates of the transistors M2 and M3 to activate or deactivate the startup circuit 12a.

The bandgap reference voltage has a stable operating point at zero current, so the startup circuit 12a is necessary to guarantee the desired mode of operation. When the bandgap reference voltage $V_{BG}$ is lower than a threshold voltage of a transistor M15 (shown in FIG. 3) of the bias circuit 10, the transistor M15 is off and $V_{START}$ will be driven high. Thus, the transistors M2 and M3 are on, resulting in connecting VA and VB nodes to the amplifier 20's output via the transistor M1. It is important to note that the transistor M1 is on during normal operation of the BGR voltage generator and that the PDB signal is high. When the PDB signal is low, this can indicate that the BGR voltage generator is being powered down, where the transistor M1 will be off.

Once the $V_{BG}$ voltage is higher than the threshold voltage of the transistor M15 of the bias circuit 10, $V_{START}$ will be low. Thus, the transistors M2 and M3 are off. To reduce the current leakage, two transistors M2 and M3 are used to inject the signal, which contributes the leakage and makes a symmetrical structure. Additionally, the voltage, $V_{amp}$, generated by the amplifier 20's output, is independent of supply voltage. To bias the operational amplifier, a self-biased circuit is used along with some diode-connected stacking transistors.

The PTAT generation circuit 14 generates a current I2 that has a positive temperature coefficient due to the base-emitter voltage difference of the transistors M4 and M5. The current I2 is mirrored in the CTAT generation circuit 16, and is further summed with current generated in the CTAT generation circuit 16, which has a negative temperature coefficient. By adjusting the passive network in the CTAT generation circuit 16, the temperature dependence can be cancelled during summing of the currents.

For instance, a typical BJT's base-emitter voltage ("$V_{BE}$") has a negative temperature coefficient ("TC") that acts complementary to absolute temperature, while the difference of two base-emitter voltages $\Delta V_{BE}$ exhibits positive TC and acts proportional to absolute temperature. Under a condition that there are two different current densities for transistors M4 and M5 used (i.e., $\Delta V_{BE} = V_T$ ln n where n is the ratio between the two current densities and $V_T$ is a thermal voltage used for a BJT and typically around 25 mV, depending on the BJT). A linear combination of these two voltages stemming from summing PTAT contributions and CTAT contributions can generate a bandgap reference voltage with zero or nearly-zero temperature coefficients.

The amplifier 20 of the PTAT generation circuit 14 has its output coupled to gates of the transistors M6 and M7 of the current mirror CM1 and to gates of the transistors M8 and M10 of the current mirror CM2. A first input of the amplifier 20 is coupled to a node VB, which is further coupled to an output of the current mirror CM1 and to the transistor M4. A second input of the amplifier 20 is coupled to a node VA, which is further coupled to another output of the current mirror CM1 and to the resistor R1. The resistor R1 is further serially connected with the transistor M5.

The transistors M4 and M5 can be BJTs having different current densities. The BJT M4 can have a base and a collector coupled to ground. The BJT M5 can also have a base and a collector coupled to ground.

Since the current mirrors CM1 and CM2 mirror each other as well and are both controlled by the amplifier 20's output $V_{amp}$, the current I2 from the current mirrors CM1 and CM2 should be equal.

In the CTAT generation circuit 16, the current mirror CM2 has two outputs, where the passive network 30 is coupled to those outputs. In particular, the resistors R3 and R4 are serially connected across the outputs of the current mirror CM2. The resistor R2 is connected across one of the outputs of the current mirror CM2 and ground. The transistor M9 can be a BJT that has a base and a collector coupled to ground. The BJT M9 provides a negative temperature coefficient that can be cancelled when summed with the current density generated in the PTAT generation circuit 14.

The resistor capacitor ("RC") filter 32 can be optionally coupled to the connection between the resistor R3 and the resistor R4 of the passive network 30 for stabilizing the bandgap reference voltage $V_{BG}$. Thereby a stabilized bandgap reference voltage $V_{BG}$ can be generated. It can be appreciated that the RC filter 30 is an optional component in conjunction with the present disclosure. In such case where the RC filter 30 is not used, an output node for generating the bandgap reference voltage $V_{BG}$ can be located at the connection between the resistors R3 and R4.

Voltages at the VA and VB nodes can be equal due to the operational amplifier 20, such that a voltage value across the resistor R1 is equal to a difference voltage of VBE of the diode-connected BJT transistors M4 and M5. Since the base and the collector of each of the BJT transistors M4 and M5 are connected (thereby functionally a diode), transistors M4 and M5 can be referred to as diode-connected BJTs. Thus, a current value for I2 across R1 can be defined by the following equation:

$$I_1 = I_2 = \frac{V_{BE4} - V_{BE5}}{R1} = \frac{1}{R1} V_T \ln n \qquad \text{EQ[1]}$$

Where $V_T$ is the thermal voltage of the BJT and n is the ratio between of the two current densities of BJT transistors M4 and M5.

In the output $B_{GR}$ voltage, in the case where the RC filter 32 is not present, $V_{BG}$ is, $$V_{BG} = \frac{R2 + R3}{R2 + R3 + R4} V_{BE9} + \frac{R2 R4}{R2 + R3 + R4} I_2 \qquad \text{EQ[2]}$$

$$V_{BG} = \frac{R2 + R3}{R2 + R3 + R4} V_{BE9} + \frac{R2 R4}{R1(R2 + R3 + R4)} V_T \ln n \qquad \text{EQ[3]}$$

Assuming R2=R3=R4 for simplification, the $B_{GR}$ voltage can be expressed by, $$V_{BG} = \frac{2}{3} V_{BE9} + \frac{R2}{3R1} V_T \ln n \qquad \text{EQ[4]}$$

The BGR output voltage can be a summation of a CTAT voltage, i.e., $V_{BE}$, from the CTAT generation circuit and a PTAT voltage, i.e., $V_T$ ln n based on the BJTs M4 and M5. Thereby, the bandgap reference voltage generator has a stable voltage over various PVT conditions. In fact, the passive components allow stabilization of the $V_{BG}$ output voltage over various PVT conditions by allowing for further manipulation of the resistance values of the passive network based on simulations. Although, the values of R2 and R3 and R4 are set to be equal in the above example, it is appreciated that the resistors values can be set based on having to generate a certain bandgap reference voltage. For instance, given a desired bandgap reference voltage, e.g., 1.25V, EQ[2]-EQ[3] can be used to set the appropriate resistor values for the resistors R2-R4 to obtain the desired bandgap reference voltage.

Also, the passive network used in the BGR output guarantees the capacitor (in RC filter included designs) has a grounded pass to de-charge through resistances R2 and R3. Without this path to ground, the bandgap output node would have a floating unknown value.

Figure 2:
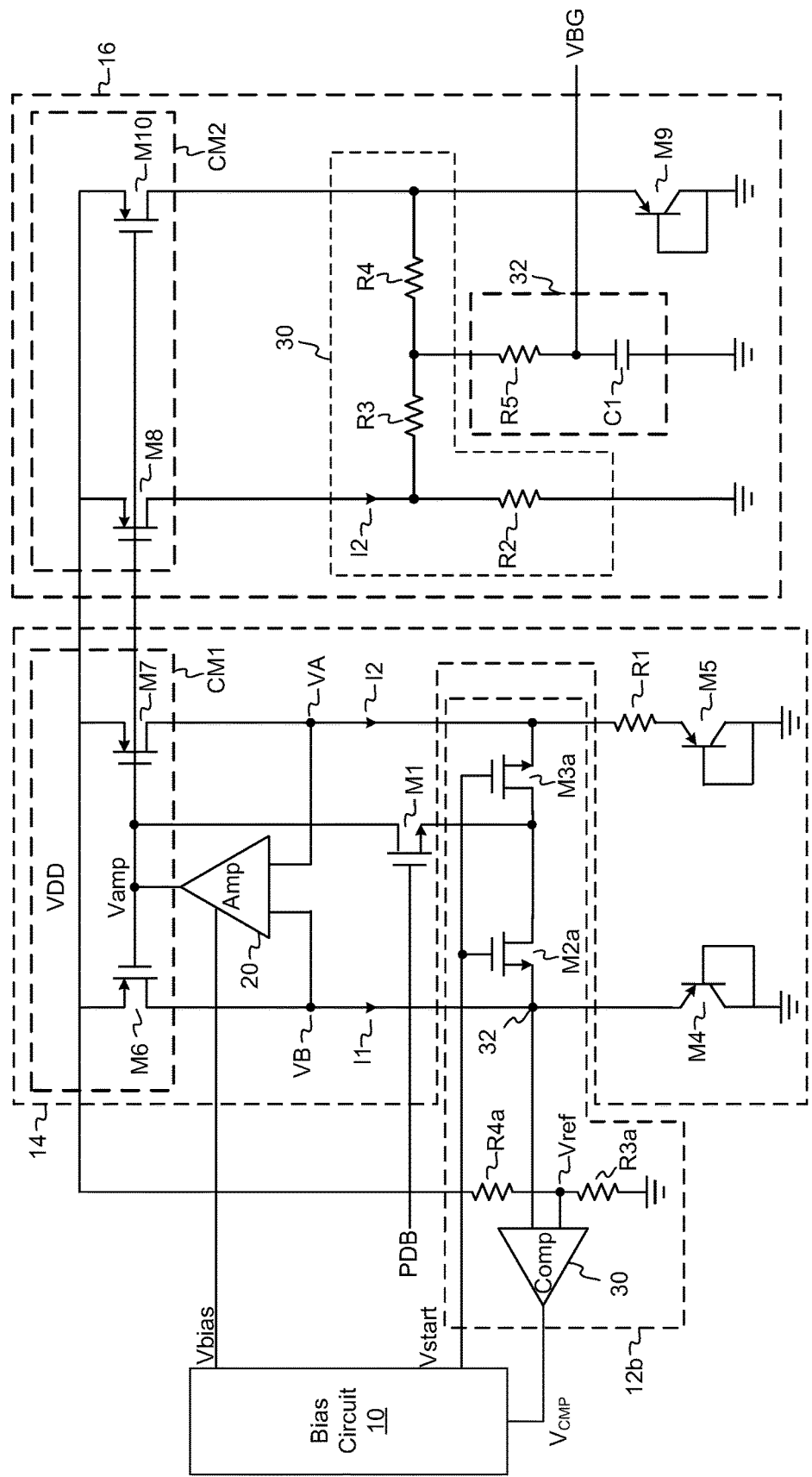
FIG. 2 illustrates a circuit diagram of another embodiment of a bandgap reference voltage generator of the present disclosure.

FIG. 2 illustrates a circuit diagram of another embodiment of a bandgap reference voltage generator of the present disclosure. In another embodiment, a startup circuit 12b can be used to start the PTAT generation circuit 14 and the CTAT generation circuit 16. Furthermore, the bandgap reference voltage $V_{BG}$ is not fed back to the bias circuit 10 to determine whether to drive the $V_{START}$ signal high for activating of the startup circuit 12b.

The startup circuit 12b comprises a comparator 30, resistors R3a and R4a, and transistors M2a and M3a. The resistors R3a and R4a are serially connected across a supply voltage VDD and ground to generate a reference voltage $V_{ref}$. The reference voltage $V_{ref}$ can be predefined and set accordingly by selecting the appropriate resistor values for the resistors R4a and R3a. For instance, the resistors R3a and R4a can be used as a voltage divider to obtain a reference voltage $V_{ref}$ greater than a threshold voltage $V_{thres}$ of an NMOS transistor. In an embodiment, the reference voltage can be set to half the supply voltage, i.e., VDD/2.

The comparator 30 compares a voltage at the node VB with the reference voltage $V_{ref}$. If the voltage at the node VB is less than the reference voltage $V_{ref}$, the comparator 30 will output a low signal for the $V_{cmp}$ signal (i.e., $V_{cmp}$=low), which is applied to the gate of the transistor M15 of the bias circuit 10. When a low signal is applied on the gate of the transistor M15, the transistor M15 is off, which in turn causes the $V_{START}$ signal to be driven high (as will be shown later in FIG. 3). In turn, a high $V_{START}$ signal is applied to the gates of the transistors M2a and M3a, thereby turning them on and activating the startup circuit 12b. The comparator 30 can ensure that the bandgap reference voltage generator works properly at the starting point.

Table 1, listed below, provides for the logic levels/statuses provided for operation of this embodiment of the bandgap reference voltage generator.

TABLE 1

| Condition | Voltage Vcmp | Transistor M15 | Voltage Vstart | Transistors M2 & M3 | Comments |
| --- | --- | --- | --- | --- | --- |
| VB < Vref | low | off | high | On | VB = VA = Vamp |
| VB > Vref | high | on | low | Off | Normal operation |

Figure 3:
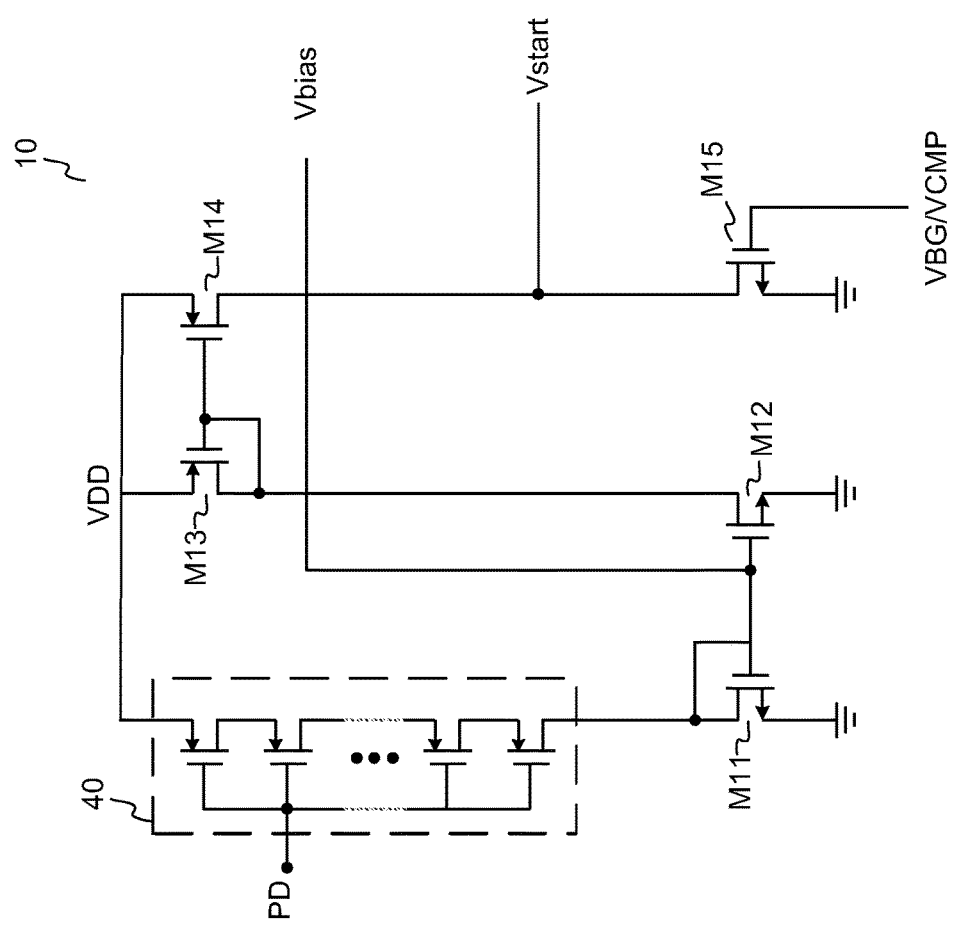
FIG. 3 illustrates a circuit diagram of a bias circuit that can be used in the present disclosure.

FIG. 3 illustrates a circuit diagram of bias circuit that can be used in the present disclosure. The bias circuit 10 comprises diode-connected transistors 40 and transistors M1-M15. The diode-connected transistors 40 and the transistor M11 are serially connected across the supply voltage VDD and ground. A power down signal PD is applied to the gates of the diode-connected transistors 40. The gate of the transistor M11 is coupled to a serial connection with the diode-connected transistors 40 and to a gate of the transistor M12 for generating the bias voltage $V_{bias}$. In a power down mode, the PD signal is high and all nodes of the BGR can be connected to VDD or ground and all circuit elements like transistors should be deactivated. In the normal operation mode, the PD signal should be low to allow the device to work properly and the elements set accordingly for normal operation. The negated power down signal PDB is low during the power down mode and high during normal operation.

The transistors M13 and M12 are serially connected across the supply voltage VDD and ground. The gate of the transistor M13 is coupled to a serial connection with the transistor M12 and to a gate of the transistor M14. The transistor M14 and transistor M15 are serially connected across the supply voltage VDD and ground. The serial connection between transistors M14 and M15 generates the $V_{START}$ signal. Furthermore, depending on the implementation of the bandgap reference voltage generator, the bandgap reference voltage $V_{BG}$ can be applied to the gate of the transistor M15 (as in the embodiment illustrated in FIG. 1) or, alternatively, the comparator output voltage $V_{cmp}$ can be applied to the gate of the transistor M15 (as in the embodiment illustrated in FIG. 2).

Operationally, when the signal $V_{BG}/V_{CMP}$ is low, then the transistor M15 is off, driving $V_{START}$ towards VDD. In such operating state, the startup circuit 12a/12b is activated. When the signal $V_{BG}/V_{CMP}$ is high, then the transistor M15 is on, driving $V_{START}$ towards ground. In such operating state, the startup circuit 12a/12b is deactivated.

It is appreciated that other bias circuit implementations or equivalent circuits can be used in conjunction with the present disclosure. The present description is an example of one of such many implementations that may be used. In no way is the foregoing description meant to limit the present disclosure to such implementation of a bias circuit.

Figure 4:
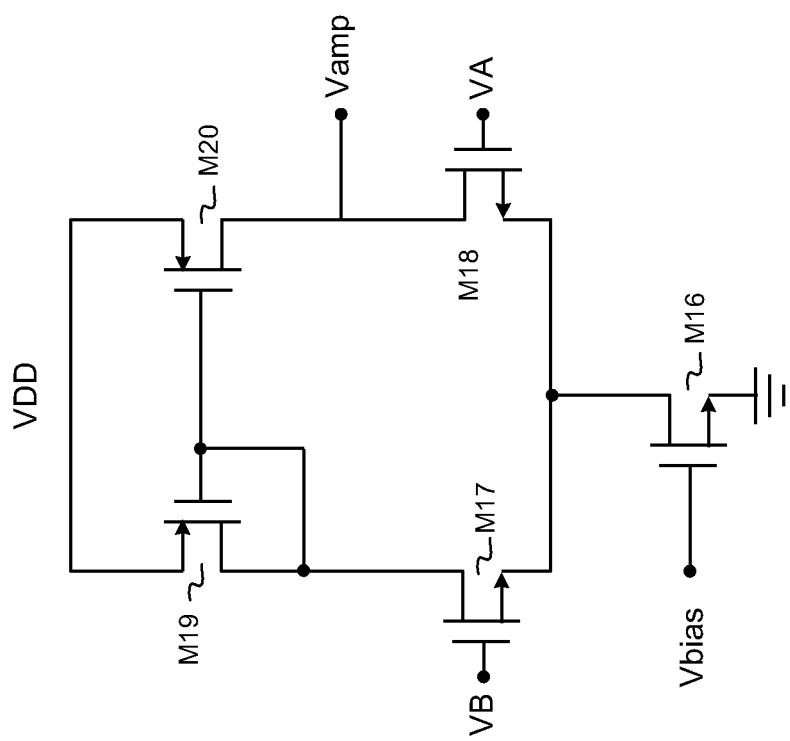
FIG. 4 illustrates a circuit diagram of an amplifier that can be used in the present disclosure.

FIG. 4 illustrates a circuit diagram of an amplifier that can be used in the present disclosure. An operational amplifier can comprise transistors M16-M20. The operational amplifier can be used to improve power supply rejection ratio ("PSRR") of the bandgap reference voltage generator. The amplifier can have a DC gain, gm*ro/2, where "gm" is current transconductance of an input transistor M17 and "ro" is an output resistance of the transistors of M18 and M20, assuming same feature size. The $V_{bias}$ voltage is a DC voltage from the bias circuit 10 to bias the transistor M16. Referring to FIG. 3, the $V_{bias}$ voltage can be generated by transistors M11—along with diode-connected transistors 40 used as a load in the drain of the transistor M11 of the bias circuit 10. The $V_{bias}$ voltage can be used to bias the transistors M12, M16, and M21.

Referring to FIG. 4, the operational amplifier can be utilized in the bandgap reference ("BGR") circuit illustrated in FIGS. 1 and 2. The amplifier can obtain a gain of more than 50 dB to control the feedback loop of the BGR circuit. Using the amplifier improves PSRR and leads to less fluctuation in the branch's current and thus in the bandgap reference voltage $V_{BG}$. In fact, the branch's current I2 can be independent of supply voltage.

It is appreciated that other operational amplifier circuit implementations or equivalent circuits can be used in conjunction with the present disclosure. The present description is an example of one of such many implementations that may be used. In no way is the foregoing description meant to limit the present disclosure to such implementation of an operational amplifier.

Figure 5:
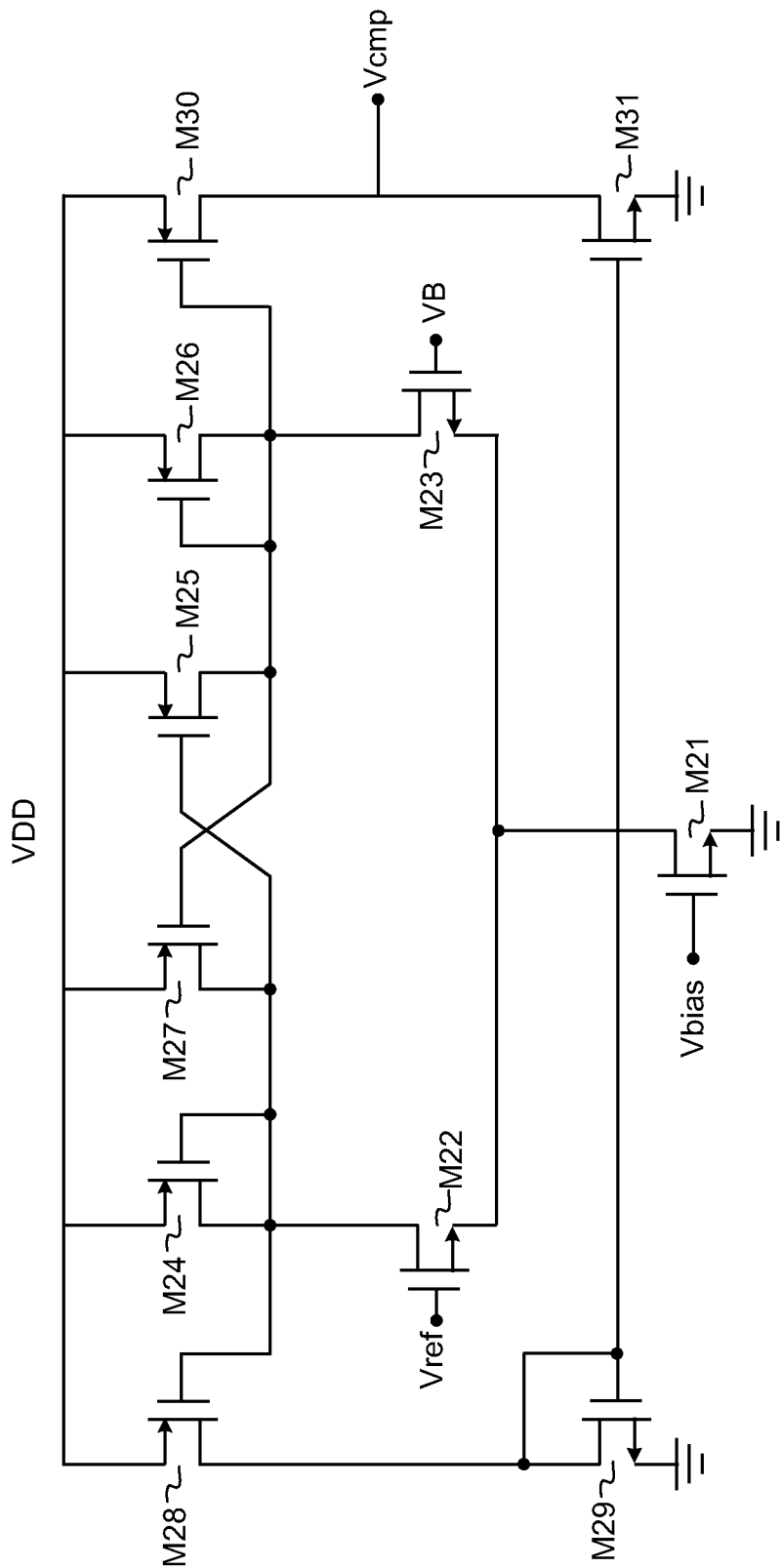
FIG. 5 illustrates a circuit diagram of a comparator that can be used in the present disclosure.

FIG. 5 illustrates a circuit diagram of a comparator that can be used in the present disclosure. A comparator used in a startup circuit can comprise transistors M21-M31. The comparator can utilize a two-stage structure.

The first stage consists of the differential input stages having transistors M21-M27. The transistor M21 is the tail current, and the transistors M22 and M23 are the source coupled differential input pair. Two cross-coupled current sources are used as load including the transistors M24 and M25 and another load includes the transistors M26 and M27. These two current samples can make a symmetrical load.

The second stage is composed of the transistors M28-M31, where the transistors M28 and M30 are a common source and the transistors M29 and M31 are a current source. The second stage can be used to increase drive capacity. The $V_{bias}$ can be generated from the bias circuit 100.

It is appreciated that other comparator circuit implementations or equivalent circuits can be used in conjunction with the present disclosure. The present description is an example of one of such many implementations that can be used. In no way is the foregoing description meant to limit the present disclosure to such implementation.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A bandgap reference voltage generator, comprising:
    a bias circuit configured to generate a start signal;
    a startup circuit having at least two serially-connected transistors configured to receive the start signal;
    a proportional-to-absolute-temperature ("PTAT") generation circuit having a first current mirror, an amplifier, a resistor, and transistors, wherein the at least two serially-connected transistors are connected across a first input of the amplifier and a second input of the amplifier; and
    a complementary-to-absolute-temperature ("CTAT") generation circuit having a second current mirror, a passive network of resistors, and at least one transistor,
    wherein an output of the amplifier is coupled to the first current mirror and the second current mirror,
    wherein the passive network of resistors is coupled across outputs of the second current mirror, and
    wherein the CTAT generation circuit has an output node for outputting a bandgap reference voltage.

2. The bandgap reference voltage generator of claim 1 wherein the output node is coupled to the bias circuit for determining the start signal.

3. The bandgap reference voltage generator of claim 1 wherein the gates of the at least two serially-connected transistors of the startup circuit are coupled to the bias circuit for receiving the start signal, and wherein a connection between the at least two serially-connected transistors is coupled to the output of the amplifier via a third transistor.

4. The bandgap reference voltage generator of claim 3 wherein the third transistor is configured to be operated by a power down signal.

5. The bandgap reference voltage generator of claim 1 wherein the startup circuit comprises a first transistor, a second transistor, a first resistor, and a second resistor, and a comparator, wherein the first transistor and the second transistor are serially connected across the first input of the amplifier and the second input of the amplifier, wherein the first resistor and the second resistor are serially connected across a voltage supply and ground for generating a reference voltage, and wherein the comparator has a first input for receiving the reference voltage and a second input for receiving a voltage at the first input of the amplifier.

6. The bandgap reference voltage generator of claim 5 wherein an output of the comparator is coupled to the bias circuit for determining the start signal.

7. The bandgap reference voltage generator of claim 6 wherein the gates of the first transistor and the second transistor are coupled to the bias circuit for receiving the start signal, wherein a connection between the first transistor and the second transistor is coupled to the output of the amplifier via a third transistor, and wherein the third transistor is configured to be operated by a power down signal.

8. The bandgap reference voltage generator of claim 1 wherein two of the transistors of the PTAT generation circuit are bipolar junction transistors, wherein the first current mirror has a first output coupled to the first input of the amplifier and to a first bipolar junction transistor ("BJT"), wherein the first BJT has a base and a collector coupled to ground, wherein the first current mirror has a second output coupled to the second input of the amplifier and to a second BJT via the resistor of the PTAT generation circuit, and wherein the second BJT has a base and a collector coupled to ground.

9. The bandgap reference voltage of claim 1 wherein the at least one transistor of the CTAT generation circuit is a bipolar junction transistor ("BJT"), wherein the passive network is coupled across a first output of the second current mirror and a second output of the second current mirror, wherein the BJT is coupled across the second output of the second current mirror and ground, and wherein the BJT has a base and a collector coupled to ground.

10. The bandgap reference voltage generator of claim 1 wherein the passive network comprises a first resistor, a second resistor, and a third resistor, wherein the second resistor and third resistor of the passive network are serially connected across a first output of the second current mirror and a second output of the second current mirror, wherein the output node is located at a connection between the second resistor and the third resistor of the passive network, and wherein the first resistor of the passive network is coupled between the first output of the second current mirror and ground.

11. The bandgap reference voltage generator of claim 10 wherein the CTAT generation circuit further comprises a resistor-capacitor ("RC") filter for stabilizing the bandgap reference voltage at the output node, and wherein the RC filter is coupled to the output node for generating a stabilized bandgap reference voltage.

12. A bandgap reference voltage generator, comprising:
a bias circuit configured to generate a start signal;
a startup circuit having two serially-connected transistors configured to receive the start signal, wherein the gates of the two serially-connected transistors of the startup circuit are coupled to the bias circuit for receiving the start signal;
a proportional-to-absolute-temperature ("PTAT") generation circuit having a first current mirror, an amplifier, a resistor, and transistors, wherein the two serially-connected transistors are connected across a first input of the amplifier and a second input of the amplifier, wherein a connection between the two serially-connected transistors is coupled to the output of the amplifier via a third transistor, wherein the third transistor is configured to be operated by a power down signal; and
a complementary-to-absolute-temperature ("CTAT") generation circuit having a second current mirror, a passive network of resistors, and a transistor,
wherein the passive network of resistors is coupled across outputs of the second current mirror,
wherein the CTAT generation circuit has an output node for outputting a bandgap reference voltage,
wherein an output of the amplifier is coupled to the first current mirror and the second current mirror,
wherein the output node is coupled to the bias circuit for determining the start signal,
wherein two of the transistors of the PTAT generation circuit are bipolar junction transistors,
wherein the first current mirror has a first output coupled to the first input of the amplifier and to a first bipolar junction transistor ("BJT"),
wherein the first BJT has a base and a collector coupled to ground,
wherein the first current mirror has a second output coupled to the second input of the amplifier and to a second BJT via the resistor of the PTAT generation circuit,
wherein the second BJT has a base and a collector coupled to ground,
wherein the transistor of the CTAT generation circuit is a third bipolar junction transistor,
wherein the passive network is coupled across a first output of the second current mirror and a second output of the second current mirror,
wherein the third BJT is coupled across the second output of the second current mirror and ground, and
wherein the third BJT has a base and a collector coupled to ground.

13. The bandgap reference voltage generator of claim 12 wherein the passive network comprises a first resistor, a second resistor, and a third resistor, wherein the second resistor and third resistor of the passive network are serially connected across a first output of the second current mirror and a second output of the second current mirror, wherein the output node is located at a connection between the second resistor and the third resistor of the passive network, and wherein the first resistor of the passive network is coupled between the first output of the second current mirror and ground.

14. The bandgap reference voltage generator of claim 13 wherein the CTAT generation circuit further comprises a resistor-capacitor ("RC") filter for stabilizing the bandgap reference voltage at the output node, and wherein the RC filter is coupled to the output node for generating a stabilized bandgap reference voltage.

15. A bandgap reference voltage generator, comprising:
a bias circuit configured to generate a start signal;
a startup circuit having a first transistor, a second transistor, a first resistor, and a second resistor, and a comparator;
a proportional-to-absolute-temperature ("PTAT") generation circuit having a first current mirror, an amplifier, a resistor, and transistors; and
a complementary-to-absolute-temperature ("CTAT") generation circuit having a second current mirror, a passive network of resistors, and a transistor,
wherein the first transistor and the second transistor of the startup circuit are serially connected across a first input of the amplifier and a second input of the amplifier,
wherein the gates of the first transistor and the second transistor of the startup circuit are coupled to the bias circuit for receiving the start signal,
wherein the first resistor and the second resistor of the startup circuit are serially connected across a voltage supply and ground for generating a reference voltage,
wherein a connection between the first resistor and the second resistor of the startup circuit is coupled to the output of the amplifier via a third transistor,
wherein the third transistor is configured to be operated by a power down signal,
wherein the comparator has a first input for receiving the reference voltage and a second input for receiving a voltage at the first input of the amplifier,
wherein an output of the comparator is coupled to the bias circuit for determining the start signal,
wherein the passive network of resistors is coupled across outputs of the second current mirror,
wherein the CTAT generation circuit has an output node for outputting a bandgap reference voltage, and
wherein an output of the amplifier is coupled to the first current mirror and the second current mirror.

16. The bandgap reference voltage generator of claim 15 wherein two of the transistors of the PTAT generation circuit are bipolar junction transistors, wherein the first current mirror has a first output coupled to the first input of the amplifier and to a first bipolar junction transistor ("BJT"), wherein the first BJT has a base and a collector coupled to ground, wherein the first current mirror has a second output coupled to the second input of the amplifier and to a second BJT via the resistor of the PTAT generation circuit, and wherein the second BJT has a base and a collector coupled to ground.

17. The bandgap reference voltage of claim 15 wherein the at least one transistor of the CTAT generation circuit is a bipolar junction transistor ("BJT"), wherein the passive network is coupled across a first output of the second current mirror and a second output of the second current mirror, wherein the BJT is coupled across the second output of the second current mirror and ground, and wherein the BJT has a base and a collector coupled to ground.

18. The bandgap reference voltage generator of claim 15 wherein the passive network comprises a first resistor, a second resistor, and a third resistor, wherein the second resistor and third resistor of the passive network are serially connected across a first output of the second current mirror and a second output of the second current mirror, wherein the output node is located at a connection between the second resistor and the third resistor of the passive network, and wherein the first resistor of the passive network is coupled between the first output of the second current mirror and ground.

19. The bandgap reference voltage generator of claim 18 wherein the CTAT generation circuit further comprises a resistor-capacitor ("RC") filter for stabilizing the bandgap reference voltage at the output node, and wherein the RC filter is coupled to the output node for generating a stabilized bandgap reference voltage.

* * * * *